(12) United States Patent
Herntier et al.

(10) Patent No.: US 7,201,433 B2
(45) Date of Patent: Apr. 10, 2007

(54) DEFORMATION ELEMENT FOR A MOTOR VEHICLE

(75) Inventors: Matthias Herntier, Wurmberg (DE); Roberto Oggianu, Leonberg (DE); Tobias Posch, Pforzheim (DE); Frank Sautter, Reutlingen (DE); Jochen Eppele, Philippsburg (DE); Stephan Brausse, Eningen (DE)

(73) Assignee: Dr. Ing. h.c.F. Porsche Aktiengesellschaft, Stuttgart (DE)

( * ) Notice: Subject to any disclaimer, the term of this patent is extended or adjusted under 35 U.S.C. 154(b) by 172 days.

(21) Appl. No.: 11/002,115

(22) Filed: Dec. 3, 2004

(65) Prior Publication Data
US 2005/0134088 A1 Jun. 23, 2005

(30) Foreign Application Priority Data
Dec. 20, 2003 (DE) ................................. 103 60 170

(51) Int. Cl.
*B62D 25/08* (2006.01)
(52) U.S. Cl. ..................... 296/187.03; 296/187.09; 296/187.11
(58) Field of Classification Search ............. 296/181.1, 296/180.1, 187.01, 187.03, 187.11, 187.1, 296/30, 204, 205, 187.09, 187.07, 187.08; 293/102
See application file for complete search history.

(56) References Cited
U.S. PATENT DOCUMENTS 5,071,188 A * 12/1991 Thum ......................... 296/205
6,138,429 A * 10/2000 Baumgaertner ............. 52/735.1
6,141,935 A * 11/2000 Artner et al. ............... 52/735.1
6,481,690 B2 * 11/2002 Kariatsumari et al. ...... 293/155
6,811,212 B2 * 11/2004 Kasuga ....................... 296/205
7,032,961 B2 * 4/2006 Matsuda ..................... 296/204

FOREIGN PATENT DOCUMENTS

| DE | 2357419 | | 5/1975 |
| DE | 197 33 191 A1 | | 2/1999 |
| DE | 100 62 689 A1 | | 7/2002 |
| DE | 20313810 U1 | * | 11/2003 |
| DE | 203 13 810 U1 | | 12/2003 |
| EP | 0 897 356 B1 | | 3/2003 |
| EP | 1454815 | | 9/2004 |

OTHER PUBLICATIONS

European Search Report dated Mar. 31, 2005.

* cited by examiner

*Primary Examiner*—Dennis H. Pedder
*Assistant Examiner*—Melissa A. Black
(74) *Attorney, Agent, or Firm*—Crowell & Moring LLP

(57) ABSTRACT

A deformation element formed of a triangular assembly of interconnected structural channels is mounted in a trunk well in the forward section of a vehicle. In their respective longitudinal directions, the channels incorporate hollow compartments, separated by partitions, which, in the event of a collision, have an impact-energy-absorbing effect.

16 Claims, 5 Drawing Sheets

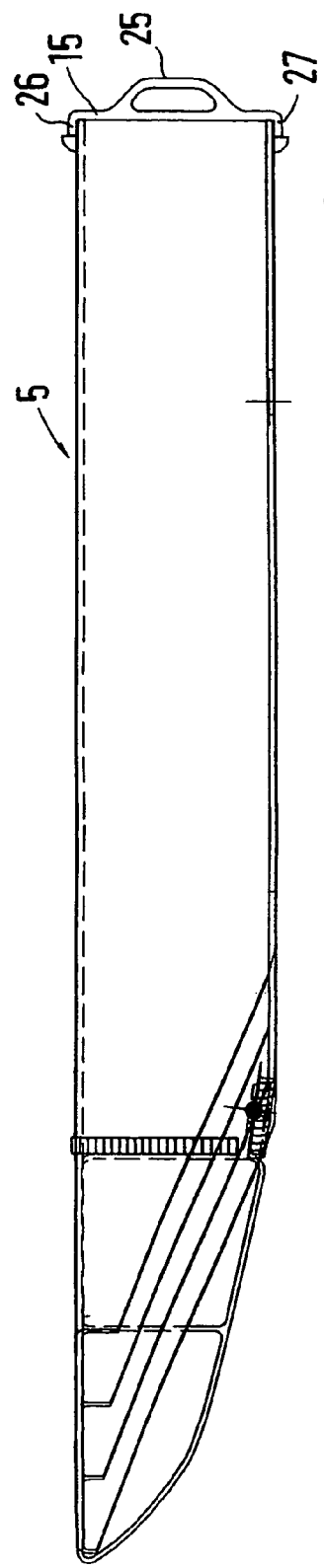
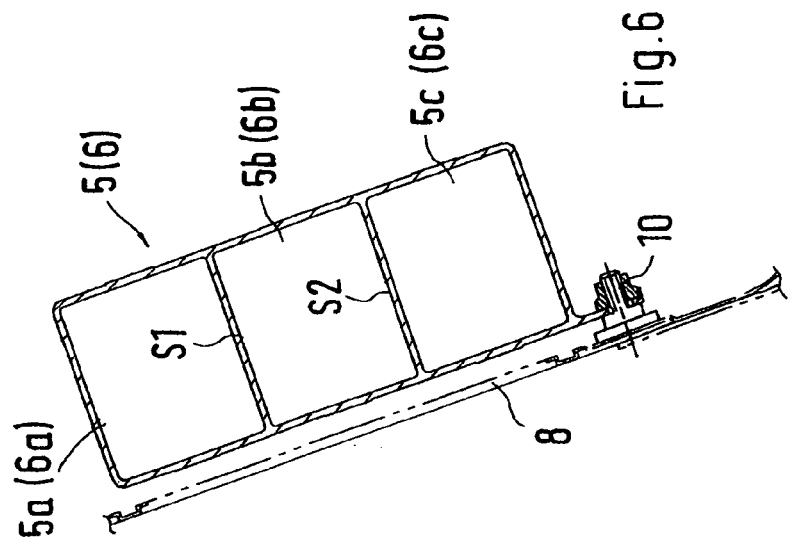

DEFORMATION ELEMENT FOR A MOTOR VEHICLE

This application claims the priority of German application 103 601 70.8, filed Dec. 20, 2003, the disclosure of which is expressly incorporated by reference herein.

BACKGROUND AND SUMMARY OF THE INVENTION

This invention relates to a deformation element for a motor vehicle installed in a fore or aft trunk well of a body of the vehicle.

German document DE 100 62 689 A1 describes a deformation element for a motor vehicle, encompassing a tubular part that has a circular cross section and is provided with both longitudinal and transverse reinforcing braces and ridges. German document DE 197 33 191 A1 in turn describes a cross beam for vehicles that features transverse and longitudinal hollow compartments separated by partitions.

It is an object of this invention to introduce a deformation element for the front or aft section of a motor vehicle, designed to absorb impact energy in the event of a collision.

According to the invention, this object is achieved by way of a triangular assembly of interconnected components including a forward structural channel, as viewed in a travel direction of the vehicle, that extends in a transverse direction relative to the vehicle and from which additional structural strut channels extend rearward, as viewed in the travel direction of the vehicle, and a transverse support plate by which free tail ends of the additional structural strut channels are connected, the transverse support plate itself being supported by the body of the vehicle. Other desirable features are defined by the dependent claims.

Advantages of this invention lie in the fact that, in the event of a collision, a so-called insert composed of structural channels and embedded in the trunk well of a vehicle will absorb energy through the ability of the structural channels to deform. Specifically, the invention provides for the deformation element to consist of an integral triangular assembly with a forward structural channel—viewed in the travel direction F of the vehicle—which extends transversely relative to the vehicle, which transverse channel connects to other structural channels, i.e. struts that extend tailward, and with free rearward ends that are connected to one another via a transverse support plate which is itself supported by the body of the vehicle.

An advantageous result according to the invention is that in the event of a collision the forward structural cross channel and the additional structural channels or struts extending obliquely within the vehicle will buckle, thus absorbing impact energy. This structural channel assembly or insert is supported on a transverse bulkhead in the vehicle or on a frame member of the vehicle.

The structural channels are mutually connected in such a manner that each of the struts extending obliquely tailward is attached to the respective end face of the forward structural channel, with an inside wall surface of the strut butting against the end face of the forward structural channel while the front-end faces of the struts remain exposed. The forward structural channel features a minimum of two hollow compartments with a square cross section, extending in the longitudinal direction of the channel and separated by an internal partition. Each of the struts extending obliquely rearward features a minimum of three hollow longitudinal compartments with a square cross section separated by two internal partitions. This configuration of the individual structural channels in the trunk well absorbs the impact in the central area of the vehicle via the transversely positioned structural channel while lateral impact from the outside is absorbed more or less by the end faces or front ends of the structural channels.

The strut channels extend obliquely tailward—viewed in the direction of travel of the vehicle—from the forward structural cross channel, in a way as to converge and enclose between them and the forward cross channel a triangular empty space that allows the channels to buckle in the event of a collision.

To permit the secure attachment of the deformation element to the vehicular body, the end support plate is provided with a support lip that projects from the plane of the plate and is embedded in a weight-bearing recess of a transverse wall or transverse frame section of the vehicle chassis. This support lip projecting from the support plate is embedded in a transverse wall or frame section of the vehicle in such fashion that it leaves enough clearance behind the wall or frame section so as not to inhibit deformation of the channel in the event of a collision.

The deformation element is fastened to the body of the vehicle by way of so-called ledges through which it can be bolted to the floor of the trunk well. To permit space-saving accommodation of the deformation element in the trunk well while also optimizing impact absorption by precisely fitting it to the contours of the trunk-well floor, this invention provides for the bottom surface of the structural channels to essentially match the contours of the trunk-well base of the vehicle body, in that a forward bottom section of the channels features a bearing surface that is filleted and transitions into a curvature that runs into the leading edge of a level surface of the structural channels. An implementation example of this invention is described in more detail below and is illustrated in the attached drawings.

BRIEF DESCRIPTION OF THE DRAWINGS

FIG. 5 is a lateral view of the deformation element in the direction of the arrow Z in FIG. 3; and FIG. 6 is a section view along line VI—VI of FIG. 3.

DETAILED DESCRIPTION OF THE INVENTION

Figure 1:
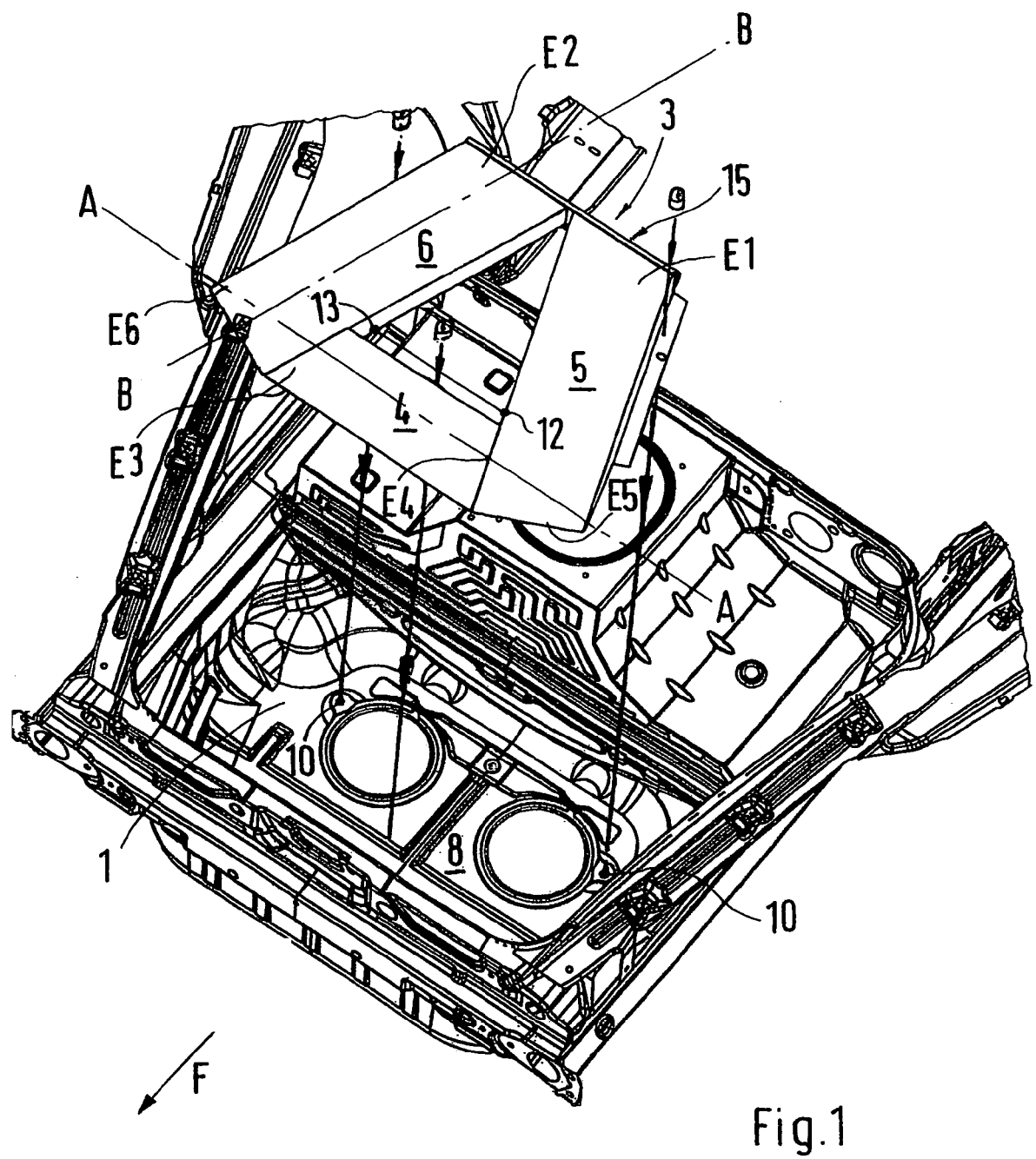
FIG. 1 is a perspective illustration of a trunk well in the forward end of a motor vehicle with an exploded view of the deformation element.
Figure 2:
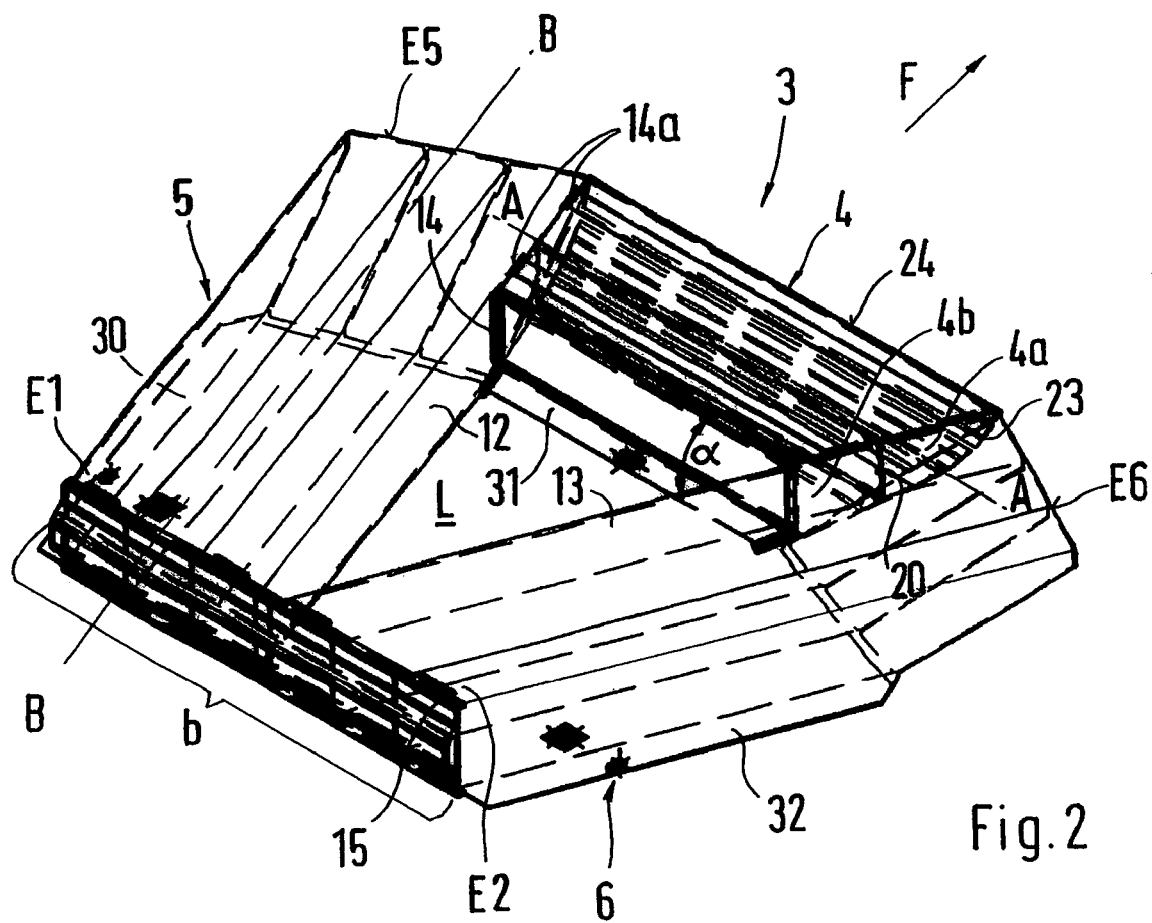
FIG. 2 is a perspective view of the deformation element.
Figure 3:
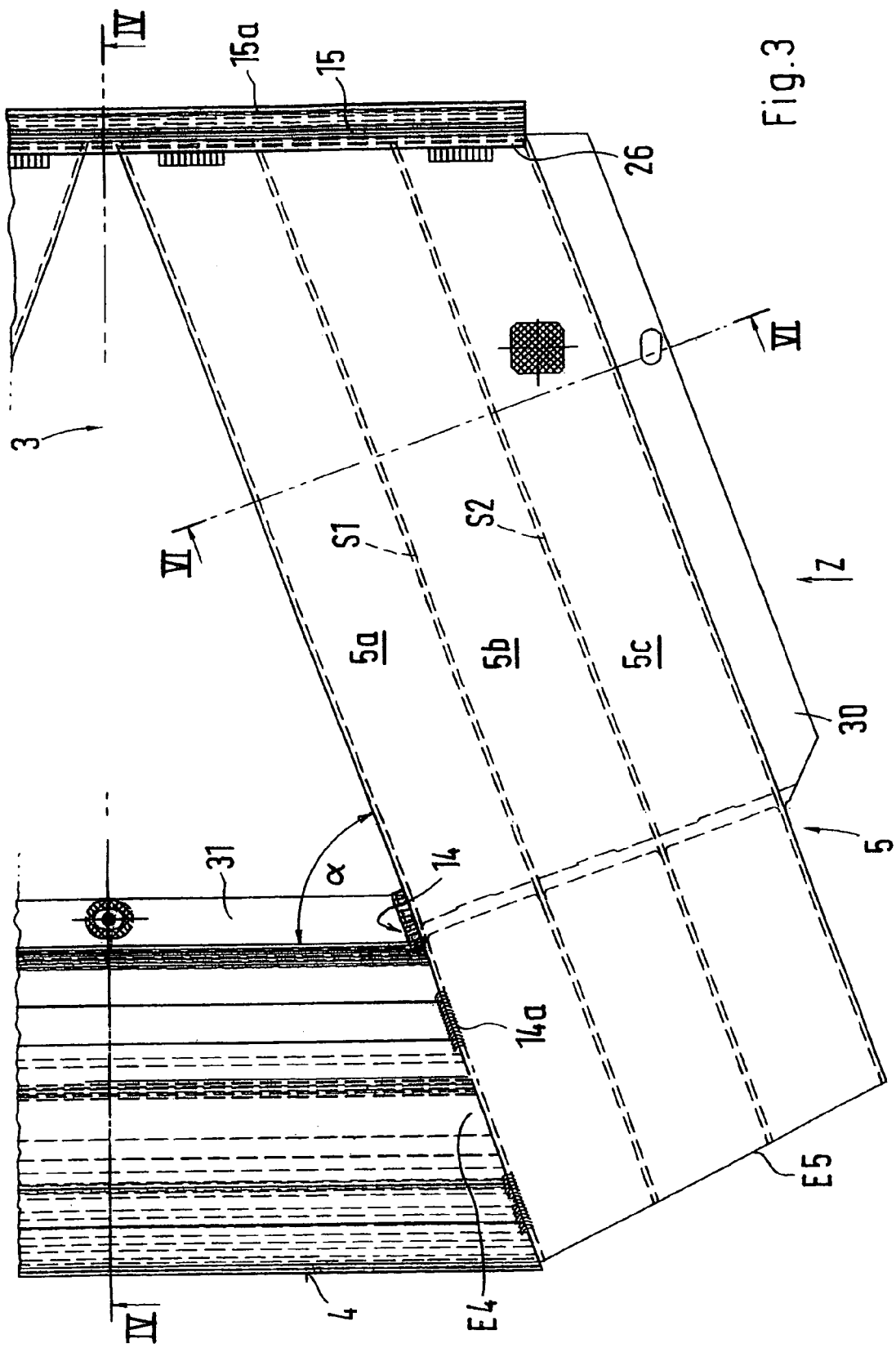
FIG. 3 is a top view of part of the deformation element.

Mounted in a trunk well 1 of a motor vehicle of which only the forward end is shown, is a deformation element 3 that consists of an assembly of at least three structural channels 4, 5 and 6 constituting an integrated module which is attached to the floor 8 of the trunk well 1 by means of fastening bolts 10.

The deformation element 3 is composed of a forward structural channel 4—as viewed in the travel direction F of the vehicle—and, connecting to it, two additional structural channels or struts 5 and 6 that extend in the longitudinal direction of the vehicle. The struts 5 and 6 may extend at an oblique angle or in some other fashion. The structural channels or struts 4, 5, and 6 are each provided on at least one side with a ledge 31, 30, and 32, respectively, through which, by means of the bolts 10, the channels or struts can be bolted to the floor 8 of the trunk well 1 of the vehicle body.

Figure 4:
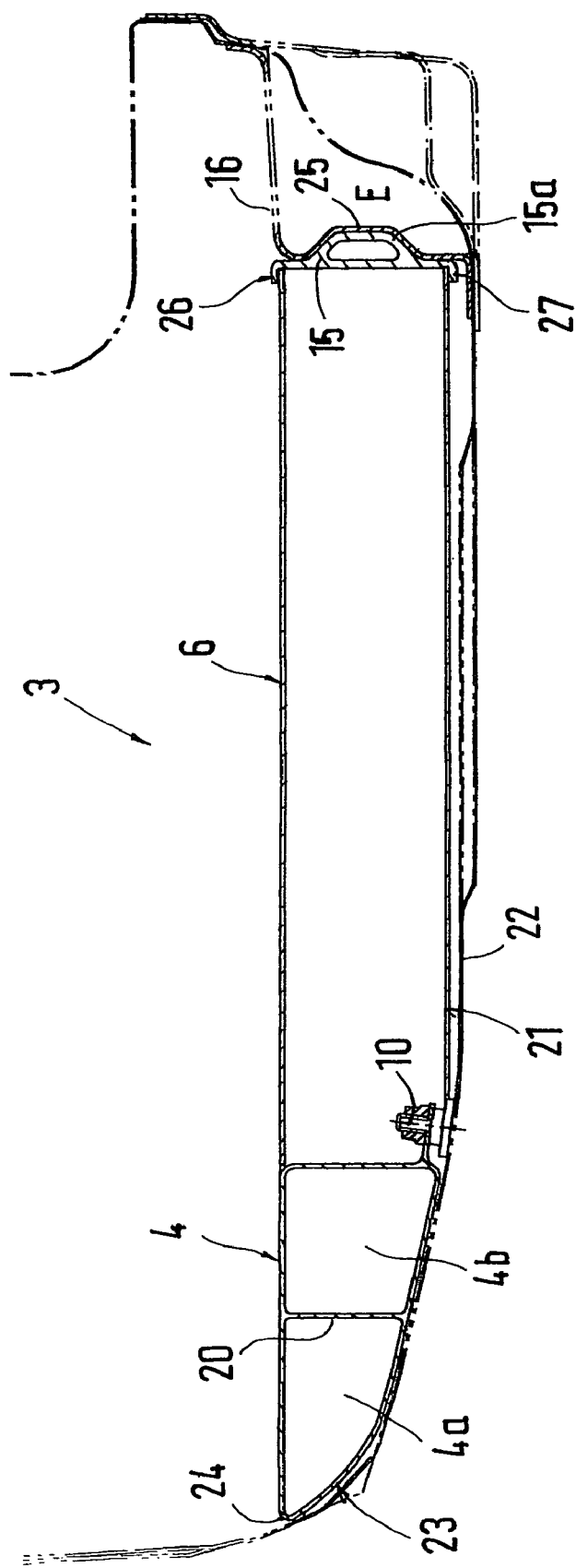
FIG. 4 is a sectional view along line IV—IV of FIG. 3.

The obliquely angled struts 5 and 6 enclose the transverse structural channel 4 between their front ends E5, E6 in a manner whereby the inner lateral surfaces 12, 13 of the struts 5, 6 connect to the end faces E3, E4 of the structural channel 4 via welded joints 14, 14*a*. The distal free ends E1, E2 of the attached strut channels 5, 6 pointing away from the structural channel 4 are firmly connected by way of a support plate 15 which on its part is supported on a transverse bracket 16 or on a wall of the vehicle body as shown in more detail in FIG. 4 and which has a length b.

The structural channels 4, 5 and 6 are aluminum extrusions containing hollow compartments that are separated by partitions. For example, the transverse structural channel 4 contains in its longitudinal direction A—A hollow compartments 4*a* and 4*b* separated by an inner partition 20. The additional structural channels, i.e. the struts 5 and 6 that extend at an angle α relative to the structural channel 4, feature along their longitudinal axes B—B hollow compartments 5*a*, 5*b*, 5*c* and, respectively, 6*a*, 6*b*, 6*c* that are mutually separated by internal partitions S1, S2.

The structural channels 4, 5 and 6 are combined into one assembly in such fashion that, together, all three channels 4, 5 and 6 form a bottom surface 21 with a contour which fairly matches that of the base 22 of the trunk well 8. To that effect the bottom surface 23 of the transverse structural channel 4 is slightly rounded, its curvature transitioning into a forward end face 24 of the hollow compartment 4*a*.

The skewed struts 5 and 6 extend from the transverse forward structural channel 4 toward the rear—as viewed in the travel direction of the vehicle—and converge there so as to form between them and the structural channel 4 an empty triangular space L.

The module that is composed of the three structural channels 4, 5 and 6 is supported within the vehicle body on the transverse bracket 16 or, respectively, on a wall of the body. To that effect the free ends E1 and E2 of the strut channels 5 and 6 are firmly connected to the support plate 15 that extends over the full combined width of the struts 5 and 6. The connection between the support plate 15 and the struts 5, 6 is established via a welded seam, while the free ends E1 and E2 of the struts 5, 6 are straddled by the legs 26, 27 of the support plate 15, as shown in more detail in FIG. 4.

For its seating on the transverse bracket 16, the support plate 15 is provided with a so-called positioning support lip 15*a* that is embedded in a recess 25 of the transverse bracket 16 or in a wall of the body. A clear space E is left behind the recess 25.

In the event of a head-on collision, the structural channels 4, 5 and 6 will crumble while absorbing impact energy, the empty space preventing the structural channels 4, 5 and 6 from blocking up.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

The invention claimed is:

1. A deformation element for a motor vehicle, installed in a fore or aft trunk well of a body of the vehicle, comprising:
    a triangular assembly of interconnected components including a forward structural channel, as viewed in a travel direction of the vehicle, that extends in a transverse direction relative to the vehicle and from which additional structural strut channels extend rearward, as viewed in the travel direction of the vehicle, and
    a transverse support plate by which free tail ends of the additional structural strut channels are connected, the transverse support plate itself being supported by the body of the vehicle,
    wherein one of the additional structural strut channels, obliquely extending rearward, is attached to each end face of the forward structural channel, and
    wherein inner wall surfaces of the additional structural strut channels butt against the end faces of the forward structural channel while the front ends of the additional structural strut channels remain open.

2. A deformation element for a motor vehicle, installed in a fore or aft trunk well of a body of the vehicle, comprising:
    a triangular assembly of interconnected components including a forward structural channel, as viewed in a travel direction of the vehicle, that extends in a transverse direction relative to the vehicle and from which additional structural strut channels extend rearward, as viewed in the travel direction of the vehicle, and
    a transverse support plate by which free tail ends of the additional structural strut channels are connected, the transverse support plate itself being supported by the body of the vehicle,
    wherein each of the additional structural strut channels incorporates at least three hollow compartments with substantially square cross sections, extending in the longitudinal direction of the strut channel, and separated by two internal partitions.

3. A deformation element for a motor vehicle, installed in a fore or aft trunk well of a body of the vehicle, comprising:
    a triangular assembly of interconnected components including a forward structural channel, as viewed in a travel direction of the vehicle, that extends in a transverse direction relative to the vehicle and from which additional structural strut channels extend rearward, as viewed in the travel direction of the vehicle, and
    a transverse support plate by which free tail ends of the additional structural strut channels are connected, the transverse support plate itself being supported by the body of the vehicle,
    wherein the transverse support plate features a support strip projecting from a plane of the support plate and embedded in load-bearing fashion in a recess of a cross wall or of a transverse bracket within structure of the vehicle body.

4. The A deformation element for a motor vehicle, installed in a fore or aft trunk well of a body of the vehicle, comprising:
    a triangular assembly of interconnected components including a forward structural channel, as viewed in a travel direction of the vehicle, that extends in a transverse direction relative to the vehicle and from which additional structural strut channels extend rearward, as viewed in the travel direction of the vehicle, and
    a transverse support plate by which free tail ends of the additional structural strut channels are connected, the transverse support plate itself being supported by the body of the vehicle,
    wherein legs of the transverse support plate span the end faces of the strut channels.

5. A deformation element for a motor vehicle, installed in a fore or aft trunk well of a body of the vehicle, comprising:
  a triangular assembly of interconnected components including a forward structural channel, as viewed in a travel direction of the vehicle, that extends in a transverse direction relative to the vehicle and from which additional structural strut channels extend rearward, as viewed in the travel direction of the vehicle, and
  a transverse support plate by which free tail ends of the additional structural strut channels are connected, the transverse support plate itself being supported by the body of the vehicle,
  wherein each of the channels is provided on at least one side with a ledge through which, by way of at least one appropriate fastener, it can be bolted to a floor of the trunk well of the vehicle body.

6. A deformation element for a motor vehicle, installed in a fore or aft trunk well of a body of the vehicle, comprising:
  a triangular assembly of interconnected components including a forward structural channel, as viewed in a travel direction of the vehicle, that extends in a transverse direction relative to the vehicle and from which additional structural strut channels extend rearward, as viewed in the travel direction of the vehicle, and
  a transverse support plate by which free tail ends of the additional structural strut channels are connected, the transverse support plate itself being supported by the body of the vehicle,
  wherein a bottom surface contour formed by a combination of the channels is adapted to the contour of a base of the trunk well so that a forward bottom section of the forward structural channel features a sloped profile transitioning into a filleted bearing surface and ultimately into a front end face of the forward structural channel.

7. A deformation element for a motor vehicle, installed in a fore or aft trunk well of a body of the vehicle, comprising:
  a triangular assembly of interconnected components including a forward structural channel, as viewed in a travel direction of the vehicle, that extends in a transverse direction relative to the vehicle and from which additional structural strut channels extend rearward, as viewed in the travel direction of the vehicle, and
  a transverse support plate by which free tail ends of the additional structural strut channels are connected, the transverse support plate itself being supported by the body of the vehicle,
  wherein the additional structural strut channels converge so as to form between them and the forward structural channel, at an angle α, a triangular empty space.

8. The deformation element as claimed in claim 1, wherein the forward structural channel incorporates at least two hollow compartments with substantially square cross sections, extending in the longitudinal direction of the forward structural channel, and separated by an internal partition.

9. A deformation element for a motor vehicle, installed in a fore or aft trunk well of a body of the vehicle, comprising:
  an assembly of interconnected components including a first structural channel that extends in a transverse direction relative to the vehicle and from which additional structural channels extend, and
  a support plate by which free ends of the additional structural channels are connected, the support plate itself being supported by the body of the vehicle,
  wherein one of the additional structural channels, obliquely extending rearward, is attached to each end face of the first structural channel, and
  wherein inner wall surfaces of the additional structural channels butt against the end faces of the first structural channel while the front ends of the additional structural channels remain open.

10. A deformation element for a motor vehicle, installed in a fore or aft trunk well of a body of the vehicle, comprising:
  an assembly of interconnected components including a first structural channel that extends in a transverse direction relative to the vehicle and from which additional structural channels extend, and
  a support plate by which free ends of the additional structural channels are connected, the support plate itself being supported by the body of the vehicle,
  wherein each of the additional structural channels incorporates at least three hollow compartments with substantially square cross sections, extending in the longitudinal direction of the channel, and separated by two internal partitions.

11. A deformation element for a motor vehicle, installed in a fore or aft trunk well of a body of the vehicle, comprising:
  an assembly of interconnected components including a first structural channel that extends in a transverse direction relative to the vehicle and from which additional structural channels extend, and
  a support plate by which free ends of the additional structural channels are connected, the support plate itself being supported by the body of the vehicle,
  wherein the support plate features a support strip projecting from a plane of the support plate and embedded in load-bearing fashion in a recess of a cross wall or of a transverse bracket within structure of the vehicle body.

12. A deformation element for a motor vehicle, installed in a fore or aft trunk well of a body of the vehicle, comprising:
  an assembly of interconnected components including a first structural channel that extends in a transverse direction relative to the vehicle and from which additional structural channels extend, and
  a support plate by which free ends of the additional structural channels are connected, the support plate itself being supported by the body of the vehicle,
  wherein legs of the support plate span the end faces of the strut channels.

13. A deformation element for a motor vehicle, installed in a fore or aft trunk well of a body of the vehicle, comprising:
  an assembly of interconnected components including a first structural channel that extends in a transverse direction relative to the vehicle and from which additional structural channels extend, and
  a support plate by which free ends of the additional structural channels are connected, the support plate itself being supported by the body of the vehicle,
  wherein each of the channels is provided on at least one side with a ledge through which, by way of at least one appropriate fastener, it can be bolted to a floor of the trunk well of the vehicle body.

14. A deformation element for a motor vehicle, installed in a fore or aft trunk well of a body of the vehicle, comprising:
  an assembly of interconnected components including a first structural channel that extends in a transverse direction relative to the vehicle and from which additional structural channels extend, and a support plate by which free ends of the additional structural channels are connected, the support plate itself being supported by the body of the vehicle, wherein a bottom surface contour formed by a combination of the channels is adapted to the contour of a base of the trunk well so that a forward bottom section of the first structural channel features a sloped profile transitioning into a filleted bearing surface and ultimately into a front end face of the first structural channel.

15. A deformation element for a motor vehicle, installed in a fore or aft trunk well of a body of the vehicle, comprising:

an assembly of interconnected components including a first structural channel that extends in a transverse direction relative to the vehicle and from which additional structural channels extend, and a support plate by which free ends of the additional structural channels are connected, the support plate itself being supported by the body of the vehicle, wherein the additional structural channels converge so as to form between them and the first structural channel, at an angle α, a triangular empty space.

16. The deformation element as claimed in claim 9, wherein the first structural channel incorporates at least two hollow compartments with substantially square cross sections, extending in a longitudinal direction of the first structural channel, and separated by an internal partition.

* * * * *